(12) United States Patent
Lee

(10) Patent No.: US 8,059,461 B2
(45) Date of Patent: Nov. 15, 2011

(54) FLASH MEMORY DEVICE

(76) Inventor: Min Kyu Lee, Icheon-si (KR)

( * ) Notice: Subject to any disclaimer, the term of this patent is extended or adjusted under 35 U.S.C. 154(b) by 278 days.

(21) Appl. No.: 12/207,279

(22) Filed: Sep. 9, 2008

(65) Prior Publication Data
US 2009/0097316 A1  Apr. 16, 2009

(30) Foreign Application Priority Data
Oct. 10, 2007 (KR) .................. 10-2007-0102297

(51) Int. Cl.
*G11C 16/08* (2006.01)
*G11C 8/12* (2006.01)

(52) U.S. Cl. .......... 365/185.11; 365/230.04; 365/185.09

(58) Field of Classification Search ............. 365/185.06, 365/185.05, 185.09, 185.11, 185.13, 230.03, 365/230.04
See application file for complete search history.

(56) References Cited

U.S. PATENT DOCUMENTS

| | | | | |
|---|---|---|---|---|
| 5,392,248 A | * | 2/1995 | Truong et al. | 365/201 |
| 5,553,026 A | * | 9/1996 | Nakai et al. | 365/201 |
| 5,671,177 A | * | 9/1997 | Ueki | 365/185.11 |
| 5,909,387 A | * | 6/1999 | Wong et al. | 365/45 |
| 5,923,587 A | * | 7/1999 | Choi | 365/185.11 |
| 5,991,202 A | | 11/1999 | Derhacobian et al. | |
| 6,118,696 A | * | 9/2000 | Choi | 365/185.11 |
| 6,314,035 B1 | * | 11/2001 | Kitade et al. | 365/201 |
| 6,400,603 B1 | * | 6/2002 | Blyth et al. | 365/185.12 |
| 6,859,395 B2 | | 2/2005 | Matsunaga et al. | |
| 7,505,322 B2 | * | 3/2009 | Lee | 365/185.17 |
| 7,715,233 B2 | * | 5/2010 | Hwang et al. | 365/185.17 |
| 2003/0031054 A1 | * | 2/2003 | Lee et al. | 365/185.17 |
| 2005/0024974 A1 | * | 2/2005 | Noguchi et al. | 365/230.03 |
| 2005/0185464 A1 | * | 8/2005 | Chih | 365/185.11 |
| 2008/0247240 A1 | * | 10/2008 | Lee | 365/185.22 |

FOREIGN PATENT DOCUMENTS

| | | |
|---|---|---|
| JP | 10-302491 | 11/1998 |
| KR | 1020050112989 A | 12/2005 |

* cited by examiner

*Primary Examiner* — VanThu Nguyen
*Assistant Examiner* — Douglas King
(74) *Attorney, Agent, or Firm* — Kilpatrick Townsend & Stockton LLP

(57) ABSTRACT

The flash memory device includes a block switch, first and second cell strings, first and second source lines, drain contacts, and first and second source contacts. The first cell string is connected to a first bit line and a second cell string is connected to a second bit line. The first and second cell strings each include a drain select transistor, a plurality of cell transistors, and a source select transistor connected in series. The drain contacts connect the first and second bit line to a semiconductor substrate. The first and second source contacts connect the first and second source lines to the semiconductor substrate. The first and second source lines in the same block are not adjacent and separated from each other by a predetermined interval.

13 Claims, 4 Drawing Sheets

FLASH MEMORY DEVICE

CROSS-REFERENCE TO RELATED APPLICATIONS

The present application claims priority to Korean patent application number 10-2007-0102297, filed on Oct. 10, 2007, which is incorporated by reference in its entirety.

BACKGROUND OF THE INVENTION

The present invention generally relates to a flash memory device, and more particularly, to a flash memory device capable of preventing disturbance in a read operation using self-boosting.

With the increasing market for mobile and multimedia products, there is an increasing demand for high-capacity non-volatile memories, such as electrically programmable and erasable flash memories, which can retain data even when power is interrupted. As a result of this demand, various flash memory types have been developed.

Commonly used flash memory types include NOR flash memory and NAND flash memory, which employ different arrangements of unit memory cells. The NOR flash memory has a higher programming rate due to using a channel hot electron (CHE) injection program mechanism and has better random access properties due to its cell array structure. However, NOR flash memory requires a greater chip area per memory cell than NAND flash memory. As a result of its greater storage density, NAND flash memory has a lower cost per memory bit than NOR flash memory. Additionally, NAND flash memories typically have increased endurance as compared to NOR flash memories. As a result, NAND flash memory is typically used for large capacity storage devices where random access time is not important.

NAND flash memory cells store data by manipulating the amount of electrical charge on a floating gate. The floating gate is located between a control gate and a channel region in the semiconductor substrate. The control gate is used to manipulate the level of electrical charge on the floating gate. The control gate is connected to a word line whereby the voltage level of the control gate can be controlled. By manipulating the voltage level of the overlying control gate relative to the underlying channel region, electrons can be transferred to or from the floating gate, thereby changing the electrical charge of the floating gate. Once the charge level of the floating gate has been set, the floating gate tends to retain the charge in the absence of a sufficiently high voltage potential differences necessary to cause subsequent transfer of electrons to or from the floating gate, thereby providing the ability to retain data when power is interrupted. Because the channel region is subjected to different electrical fields based upon the level of charge of the floating gate, the threshold voltage of the memory cell will vary according to the level of charge of the floating gate, thereby providing a way of determining the state of the memory cell. Memory cells of a NAND flash memory are in an erased state or a programmed state.

Memory cells of an erased state have a relatively low threshold voltage distribution, for example, lower than approximately 0 V. On the other hand, memory cells of a programmed state have a relatively high threshold voltage distribution, for example, higher than approximately 0 V.

A read operation for determining the state of a selected memory cell is generally performed on a page basis. In order to determine the state of the selected memory cell, the bit line of the memory cell string containing the selected memory cell is precharged to, for example, approximately 1 V to approximately 2 V. Next, the drain select transistor and the source select transistor for the selected memory cell string are turned on to form an electrical path in the memory cell string containing the selected memory cell. A pass voltage $V_{pass}$ is applied to the word lines connected to the control gates of the unselected memory cell transistors in the selected memory cell string such that the channels of the unselected memory cells are turned on regardless of a state of the unselected memory cells.

Since all the channels included in the selected memory cell string except the channel of the selected memory cell are known to be turned on, a current will flow or not through the entire cell string depending on whether the channel of the selected memory cell is turned on or off, which in turn depends upon the state of the selected memory cell. When the selected memory cell is in an erased state, the selected memory cell channel is turned on, and a current will flow through the entire cell string. As a result, the precharged bit line will be discharged to approximately 0 V on account of the bit line being connected to the drain line by way of the open channels of the selected memory cell string. On the other hand, when the selected memory cell is in a programmed state, the selected memory cell channel is turned off, a current does not flow through the cell string, thereby maintaining the precharged voltage of the bit line. As a result, it can be determined whether the selected memory cell is in an erased state or in a programmed state depending on whether the precharged voltage of the bit line decreases to approximately 0 V.

However, the application of the pass voltage $V_{pass}$ to the control gates of the unselected memory cells may result in the occurrence of a read disturbance. A read disturbance occurs when there is an unintentional altering of the state of an unselected memory cell during a read operation. While the use of higher pass voltages during a read operation results in increased current flow in the selected memory cell string due to decreased resistance of the affected channels, thereby making the determination of the state of easier by more quickly discharging the bit line, the use of higher pass voltages may cause a read disturbance. When the pass voltage becomes larger than a predetermined magnitude, the resulting voltage potential differences may result in the transfer of electrons to or from the floating gate of the unselected memory cell, thereby inadvertently altering the state of the unselected memory cell.

Inadvertent alteration of the state of an unselected memory cell can also occur during a program operation. During a program operation, a high program voltage from approximately 15 V to approximately 20 V is applied to the word line connected to the cell selected to be programmed and the bit line of the selected cell is grounded. As a result, the charge on the floating gate of the selected memory cell is altered, thereby programming the selected memory cell. Unfortunately, because the word line is also connected with the control gates of memory cells not selected for programming, these unselected memory cells may be inadvertently programmed despite the fact that their bit lines were not grounded.

In order to prevent this inadvertent programming, self-boosting, where a ground voltage (0 V) is applied to the bit line of the memory cell to be programmed and a power voltage $V_{cc}$ is applied to a bit line of a memory cells not to be programmed, is used. In such a voltage state, the ground voltage is transferred to the channel of the memory cell to be programmed, thereby enhancing the resulting voltage potential differences used to program the selected memory cell.

Also, a select transistor of the unselected bit line is turned off thereby isolating the memory cells connected to unselected bit lines and placing the channel regions of these unselected memory cells into a floating state. By using self-boosting, voltage potential differences between the floating gates of unselected memory cells and surroundings can be reduced, thereby reducing the potential for the occurrence of a program disturbance.

Self-boosting can also be used for reducing the potential for an inadvertent memory state alteration during a read operation. In a read operation using self-boosting, a voltage higher than a power voltage $V_{cc}$ is applied to unselected bit lines and source lines, while the selected source line is grounded. The channels of the unselected memory cells are thereby boosted, which decreases voltage potential differences between the gates and the channels, thereby restraining read disturbances. That is, although a pass voltage higher than approximately 5.5 V is applied to the control gates of the unselected memory cells, eventually a bias corresponding to a difference between the pass voltage and the power voltage $V_{cc}$ is applied, thereby preventing undesired programming of unselected memory cells during the read operation.

Meanwhile, in order to perform a self-boosting read operation smoothly, a common source line CSLe of an even bit line BLe and a common source line CSLo of an odd bit line BLo are separated from each other. That is, when a selected memory cell is connected to the even bit line BLe and all memory cells connected to the odd bit line BLo are in an erased state, a power voltage $V_{cc}$ applied to the odd bit line BLo may be discharged through a common source line CSL. However, when the common source line CSLe of the even bit line and the common source line CSLo of the odd bit line are separated from each other, while the common source line CSLe of the even bit line is grounded, a bias equal to or higher than the power voltage $V_{cc}$ applied to the odd bit line BLo is applied to the common source line CSLo of the odd bit line such that a voltage applied to the odd bit line BLo is not discharged through the common source line CSLo.

However, in the self-boosting read operation, when a short occurs between the common source line CSLe of the even bit line and the common source line CSLo of the odd bit line or between a source line of an even or odd bit line and a bit line due to defect generated during an interconnection process, self-boosting cannot be used and a chip fail may occur. As cell size decreases due to increased integration, separation between a bit line and a source line or between source lines is decreased, and the rate at which shorts occur may increase, thereby causing a significant reduction of yield.

SUMMARY OF THE INVENTION

Embodiments of the invention are directed to a flash memory device with a structure capable of preventing a short between source lines.

In one embodiment, a flash memory device includes: a) a memory block including: 1) a first cell string including a first drain select transistor, a first plurality of cell transistors, and a first source select transistor connected in series; 2) a first source line connected to the first source select transistor; 3) a first drain line connected to the first drain select transistor; 4) a second cell string including a second drain select transistor, a second plurality of cell transistors, and a second source select transistor connected in series; 5) a second source line connected to the second source select transistor; and 6) a second drain line connected to the second drain select transistor. This one embodiment of the flash memory further includes: b) a block switch configured to select a memory block to drive and apply a driving voltage to the selected memory block; c) a first drain contact adapted to connect the first bit line to a semiconductor substrate; d) a second drain contact adapted to connect the second bit line to the semiconductor substrate; e) a first source contact adapted to connect the first source line to the semiconductor substrate; and f) a second source contact adapted to connect the second source line to the semiconductor substrate, wherein the first and second source lines in the same block are not adjacent and separated from each other by a predetermined interval.

The block switch may include: a block select circuit adapted to apply a block select signal for selecting a memory block to drive; and pass transistors adapted to perform a switching operation for connecting the memory block with a portion of the flash memory device.

The block select circuit may include a block repair fuse for isolating a defective memory block.

The pass transistors may include a drain select transistor, a source select transistor, a cell select transistor, a transistor for selecting a first source line, and a transistor for selecting a second source line.

The transistor for the first source line may include a gate connected to a block word line, a drain connected to a first global source line, and a source connected to a first local source line.

The transistor for the second source line may include a gate connected to a block word line, a drain connected to a second global source line, and a source connected to a second local source line.

The drain contacts and the source contacts may be alternately disposed.

DESCRIPTION OF SPECIFIC EMBODIMENTS

Hereinafter, a flash memory device in accordance with the present invention will be described in detail with reference to the accompanying drawings.

Figure 1:
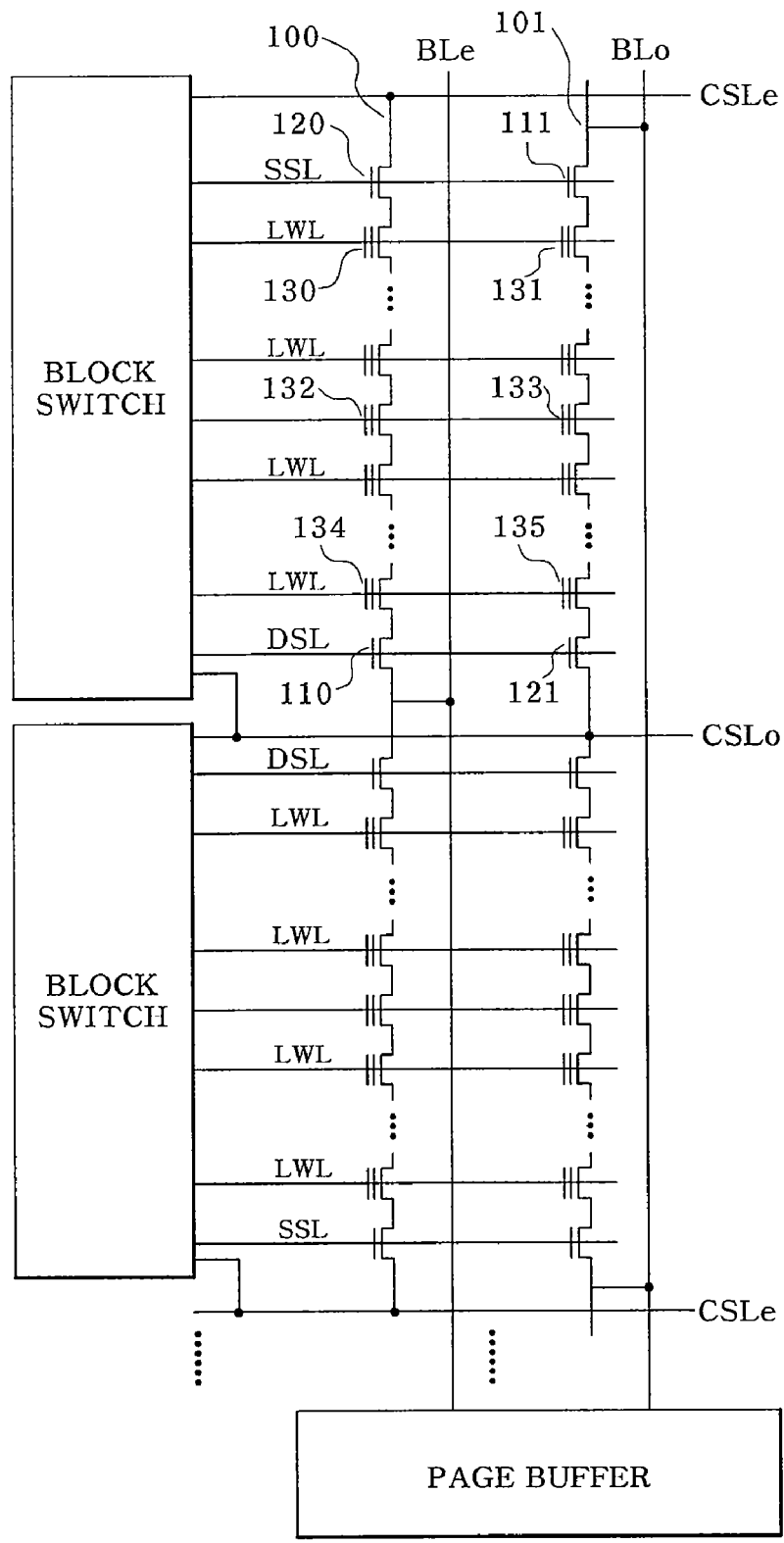
FIG. 1 illustrates a NAND flash memory device according to one embodiment of the invention.

FIG. 1 illustrates a NAND flash memory device according to one embodiment of the present invention.

The NAND flash memory device includes a plurality of cell blocks and a block switch for selecting a block to drive from the plurality of cell blocks.

The block switch selects a word line of a memory cell in response to a row address input from the outside and applies a program voltage $V_{pgm}$ or a pass voltage $V_{pass}$ transferred from a word line driver circuit (not shown) to the selected word line. The block switch will be described in detail later.

One cell block includes a plurality of cell strings 100, 101, ... each having a plurality of memory cells connected in series that share a source line and a drain line, a plurality of bit lines BLe, BLo ... , a plurality of word lines LWL, drain select transistors 110 and 111 connected between the cell strings and the bit lines, and source select transistors 120 and 121 connected between the cell strings and common source lines. The plurality of memory cells that share one word line form one page. Sources of each cell string are connected to common source lines CSLe and CSLo. Although two bit lines and two cell strings are shown in FIG. 1, a plurality of bit lines and cell strings may be disposed in a memory cell block.

In order to perform a self-boosting read operation smoothly, a common source line is separated into two separate lines with an even common source line CSLe for a memory string connected to an even bit line BLe and an odd common source line CSLo for a memory string connected to an odd bit line BLo. Without separation of the common source line, when a selected memory cell is connected to the even bit line BLe and all memory cells connected to the odd bit line BLo are in an erased state, a power voltage $V_{cc}$ applied to the odd bit line BLo may be discharged through the common source line. However, when the common source line is separated into an even common source line CSLe and an odd common source line CSLo, any power voltage Vcc applied to the odd bit line Blo will be prevented from being discharged due to the lack of a common source line.

The divided common source lines CSLe and CSLo are connected to block switches and are switched separately by pass transistors (not shown) in the block switches. A fuse (not shown) for repairing a defective block is provided in the block switch. When a short occurs between the even common source line CSLe and the odd common source line CSLo or between the common source lines CSLe and CSLo and the bit lines BLe and BLo, a corresponding defective block is treated as an invalid block using a block repair fuse in the block switch so as not to affect other blocks, thereby preventing an entire chip from becoming useless.

Figure 2:
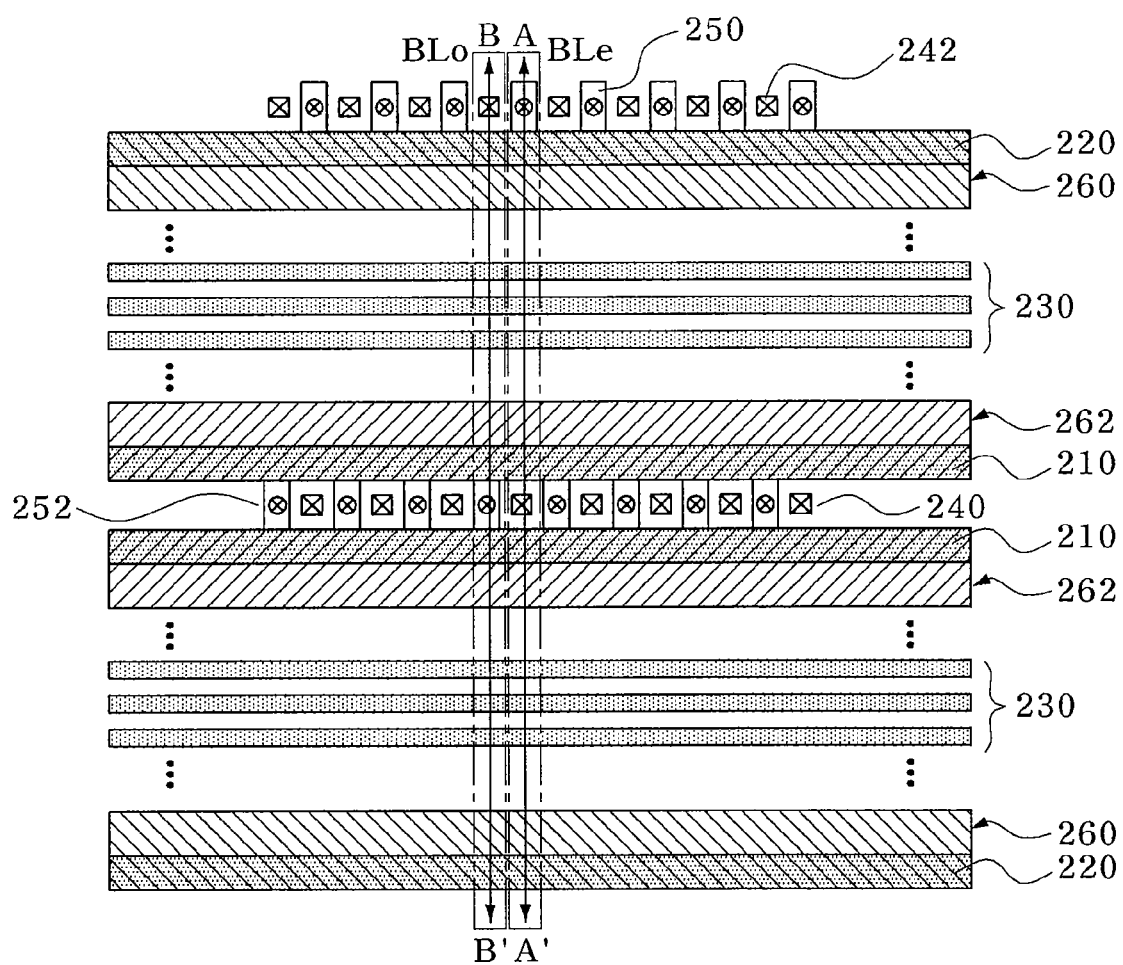
FIG. 2 illustrates a plan view of a flash memory device according to one embodiment of the invention.

FIG. 2 illustrates a plan view of a flash memory device according to one embodiment of the invention.

A plurality of word lines 230 are arranged in parallel so as to intersect an active region and bit lines BLe and BLo arranged in a direction perpendicular to the word lines 230. Although two bit lines are shown in FIG. 2, a plurality of bit lines may be disposed in a cell array region of a flash memory device. A drain select line 210 is disposed at one side of the word lines 230 and a source select line 220 is disposed parallel to the word lines 230 at other side the word lines 230.

Meanwhile, a common source line, which connects sources of each cell string, is divided into an even common source line 260 and an odd common source line 262. Therefore, a read operation using self-boosting can be smoothly performed. The sources of each cell string are connected to the common source lines 260 and 262. Here, sources of cell strings connected to an even bit line BLe are connected to the even common source line 260 and sources of cell strings connected to an odd bit line BLo are connected to the odd common source line 262. The even common source line 260 and the odd common source line 262 are not adjacent to each other and a predetermined interval is maintained therebetween, e.g., by one or more word lines 230. In a conventional flash memory device, since a source contact of an even common source line is adjacent to a source contact of an odd common source line, the possibility of a short occurrence is relatively high. However, according to the present embodiment, source contacts 250 and 252 and drain contacts 240 and 242 are alternately disposed as shown. When a short occurs between the source contacts 250 and 252, the entire block is treated as an invalid block by block repair, however, when a short occurs between source contacts 250 and drain contact 242, or between source contact 252 and drain contact 240, only a defective column may be treated as an invalid column by column repair, thereby greatly improving the yield rate of the flash memory device.

Figure 3A:
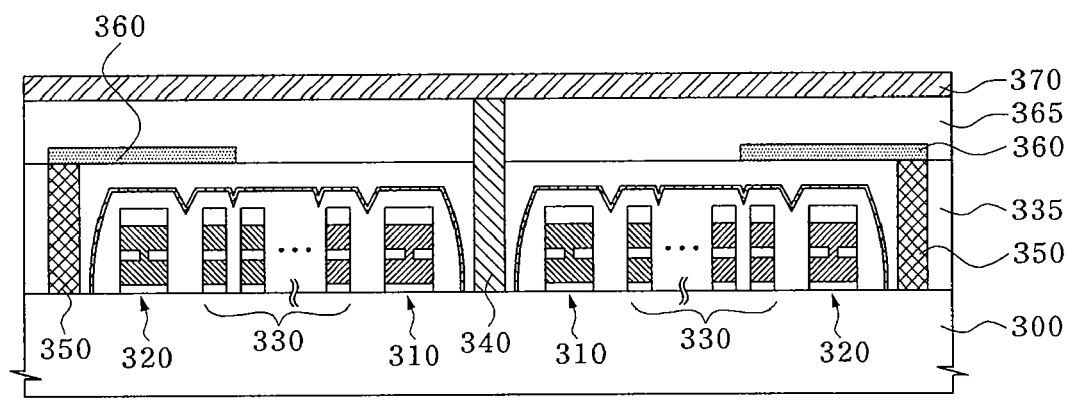
FIG. 3A illustrates a cross-sectional view of a flash memory device taken along a line A-A' of FIG. 2.
Figure 3B:
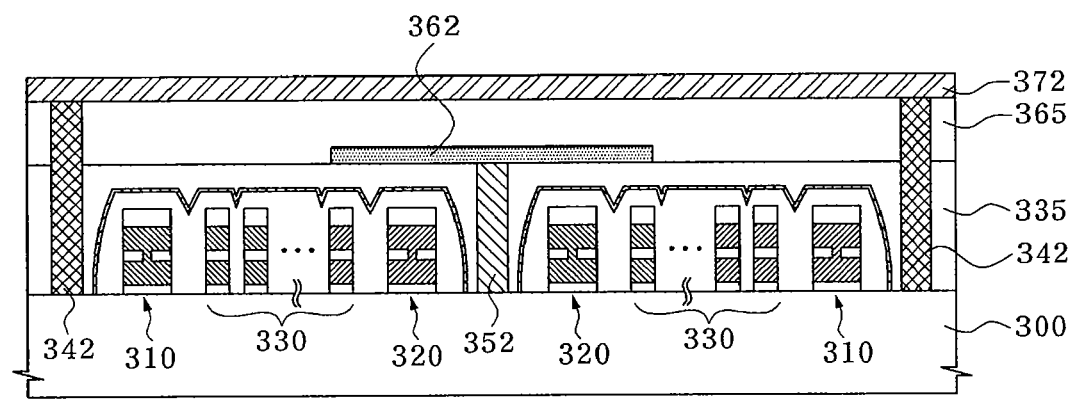
FIG. 3B illustrates a cross-section view of a flash memory device taken along a line B-B' of FIG. 2.

FIG. 3A illustrates a cross-sectional view of a flash memory device taken along a line A-A' of FIG. 2 and FIG. 3B illustrates a cross-section view of a flash memory device taken along a line B-B', according to one embodiment of the invention.

Referring to FIGS. 3A and 3B, a drain select transistor 310, a source select transistor 320, and a plurality of cell transistors 330 connected in series therebetween are disposed to form one cell string on a semiconductor substrate 300. Although two cell strings of adjoining blocks are shown in FIGS. 3A and 3B, a plurality of cell strings may be disposed in a cell array of a flash memory device.

The drain select transistor 310 and the source select transistor 320 are MOS transistors including a gate insulating layer, a gate, and source/drain. The cell transistors 330 are transistors including a tunnel insulating layer, a floating gate, an interlayer insulating layer, a control gate, and source/drain. Although not shown in detail, an insulating spacer may be further provided at sidewalls of gate patterns of the drain and source select transistors, and the cell transistors. Interlayer insulating layers 335 and 365 for insulating the gate patterns from upper conductive layers are formed on the semiconductor substrate 300 including the gate patterns. Even bit line BLe 370 and odd bit line BLo 372 are disposed on the interlayer insulating layer 365 and is connected to an impurity region of the semiconductor substrate 300 through drain contacts 340 and 342 respectively.

The drain contact 340 (see FIG. 3A) is disposed between the drain select transistors 310 and penetrates the interlayer insulating layers 335 and 365 to be connected to the impurity region of the semiconductor substrate 300. Source contacts 350 connect common source lines 360 to impurity regions of the semiconductor substrate 300, that is, the sources of the cell strings. The common source lines 360 and 362 are disposed on the interlayer insulating layer 335. Here, an even common source line 360 and an odd common source line 362 are disposed at a predetermined interval, thereby greatly reducing a possibility of a short occurrence between the common source lines 360 and 362. In addition, even when a short occurs between the source contact 350 and drain contact 342, or between source contact 352 and drain contact 340, the short can be addressed by column repair, as compared with a conventional structure, where an entire block is treated as an invalid block.

Figure 4:
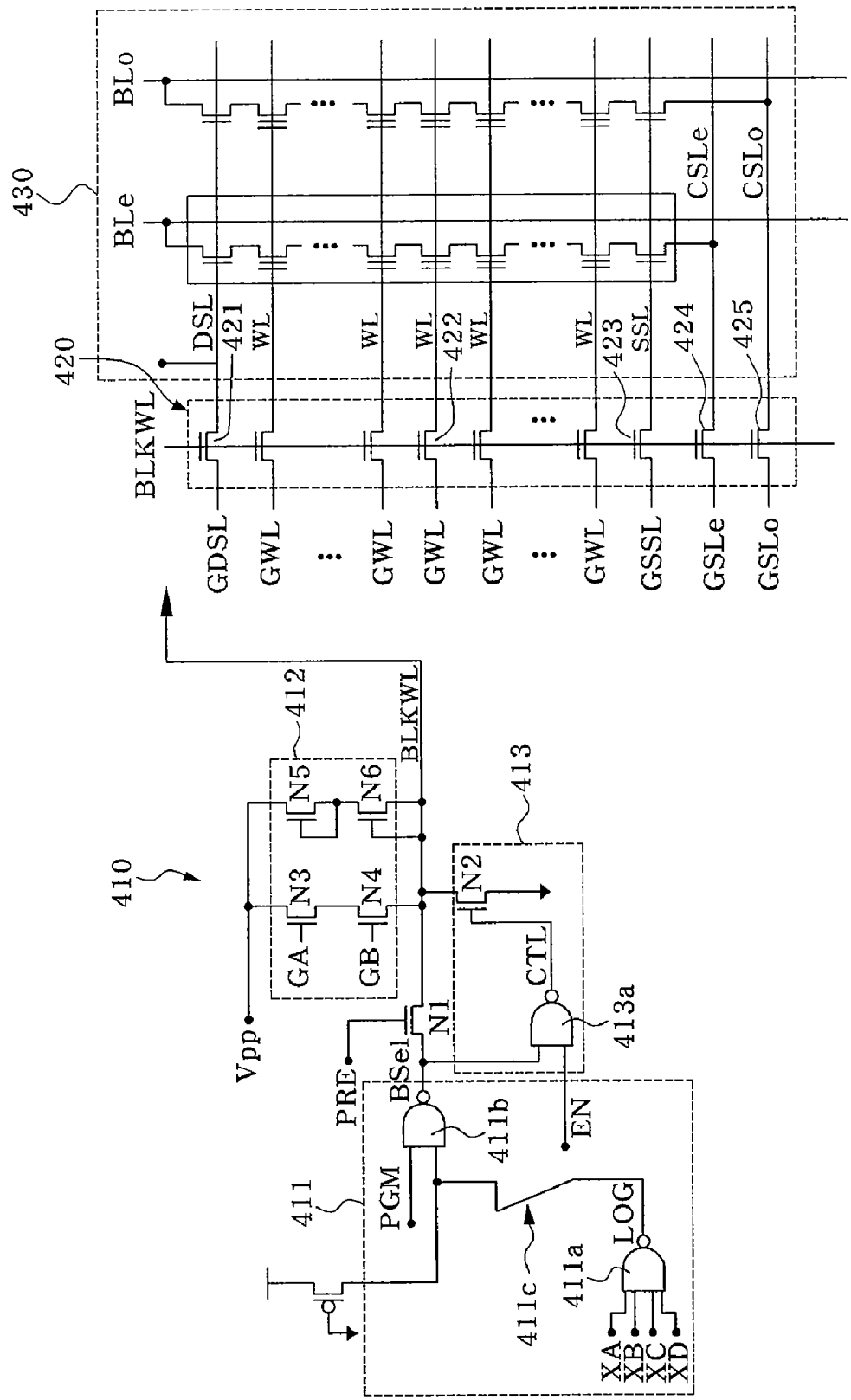
FIG. 4 illustrates a view of a block switch of a NAND flash memory device according to one embodiment of the invention.

FIG. 4 illustrates a view of a block switch of a NAND flash memory device according to one embodiment of the invention.

The block switch outputs a block select signal for turning on a pass transistor of a selected block and turning off a pass transistor of an unselected block. The block switch includes a block select circuit 410 and pass transistors 420.

The pass transistors 420 perform switching operation for applying a predetermined voltage to word lines WL in a cell block 430 through global word lines GWL. The pass transistors 420 include a drain select transistor 421, a cell select transistor 422, a source select transistor 423, a transistor 424 for an even common source line, and a transistor 425 for an odd common source line.

The block select circuit 410 includes a control logic circuit 411, a precharge circuit 412, and a discharge circuit 413.

The control logic circuit 411 includes NAND gates 411a and 411b. When all input predecoding signals XA, XB, XC and XD are at a high level, the NAND gate 411a outputs a logic signal LOG of a low level. When any one of the predecoding signals XA, XB, XC and XD is at a low level, the NAND gate 411a outputs a logic signal LOG of a high level.

When both the logic signal LOG and a program control signal PGM are at a high level, the NAND gate 411b outputs a block select signal BSel of a low level. When any one of the logic signal LOG and the program control signal PGM is at a low level, the NAND gate 411b outputs a block select signal BSel of a high level. The program control signal PGM is maintained at a low level during a set precharge section, and thereafter becomes a high level. An NMOS transistor N1 includes a drain connected to an output terminal of the NAND gate 411b and a source connected to a block word line BLKWL. The NMOS transistor N1 is turned on or turned off in response to a precharge control signal PRE input to a gate thereof. The precharge control signal PRE is enabled during a precharge operation. When the NMOS transistor N1 is turned on, a block select signal BSel is transferred to the block word line BLKWL.

The precharge circuit 412 includes a switching circuit and a clipping circuit.

The switching circuit includes NMOS transistors N3 and N4. The NMOS transistor N3 includes a drain connected to an input voltage $V_{pp}$ and a source connected to a drain of the NMOS transistor N4. A source of the NMOS transistor N4 is connected to the block word line BLKWL. Address coding signals GA and GB are input to gates of the NMOS transistors N3 and N4, respectively. The address coding signals GA and GB are signals for selecting memory cells controlled by the block switch. When the NMOS transistors N3 and N4 are turned on, the block word line BLKWL is precharged to an operating voltage $V_{pp}$ level. The clipping circuit includes NMOS transistors N5 and N6. When a voltage level of the block word line BLKWL increases more than a predetermined voltage level, the NMOS transistors N5 and N6 maintain the voltage level of the block word line BLKWL at the predetermined voltage level.

The discharge circuit 413 includes a NAND gate 413a and an NMOS transistor N2. The NAND gate 413a outputs a control signal CTL in response to a block select signal BSel and an enable signal EN. When both a block select signal BSel and an enable signal EN are at a high level, the NAND gate 413a outputs a control signal CTL of a low level. When any one of a block select signal BSel and an enable signal EN is at a low level, the NAND gate 413a outputs a control signal CTL of a high level. The enable signal EN is maintained at a high level when the block switch operates.

A control signal CTL is input to a gate of the NMOS transistor N2. A drain and a source of the NMOS transistor N2 are connected to the block word line BLKWL and a ground, respectively. When the NMOS transistor N2 is turned on, the block word line BLKWL is discharged to a ground level.

Meanwhile, the control logic circuit 411 includes a block repair fuse 411c for repairing a block. When a defective block is generated, the block repair fuse 411c can be physically cut outside. When a short occurs between an even source line and an odd source line or between a source line and a bit line during a self-boosting read operation, the block repair fuse 411c of the defective block is cut. When the block repair fuse 411c is cut, a logic signal LOG is not transferred to the NAND gate 411b, and thus the NAND gate 411b outputs a block select signal BSel of a low level and the NAND gate 413a outputs a control signal CTL of a high level. Accordingly, since the discharge transistor N2 is always turned on, the defective block does not operate.

Gates of the pass transistors 420 including high voltage NMOS transistors are connected to the block word line BLKWL. The pass transistors are turned on when the block word line BKWL is precharged to an operating voltage $V_{pp}$ level. A drain and a source of the NMOS transistor 421 are connected to a global drain select line GDSL and a local drain select line DSL, respectively. A drain and a source of the NMOS transistor 422 are connected to the global word line GWL and a local word line WL, respectively. A drain and a source of the NMOS transistor 423 are connected to a global source select line GSSL and a local source select line SSL, respectively. A drain and a source of the NMOS transistor 424 are connected to a global even source line GSLe and a local even source line CSLe, respectively. A drain and a source of the NMOS transistor 425 are connected to a global odd source line GSLo and a local odd source line CSLo.

According to the present invention, a short occurrence between two source lines can be reduced by disposing an even common source line CSLe and an odd common source line CSLo in the same block such that they are separated from each other by a predetermined interval, not adjacent to each other. In addition, a short occurrence between source contacts can be reduced by alternately disposing a source contact and a drain contact. Furthermore, even when a short occurs between the source contact and the drain contact, only a defective column can be treated as an invalid column by column repair, thereby greatly improving the yield rate of a flash memory device.

While the present invention has been described with respect to the specific embodiments, it will be apparent to those skilled in the art that various changes and modifications may be made without departing from the spirit and scope of the invention as defined in the following claims.

What is claimed is:

1. A flash memory device, comprising:
   a first block switch configured to select a first memory block to drive of a plurality of memory blocks and apply a driving voltage to the first memory block, the first block switch including a first transistor for selecting a first common source line and a second transistor for selecting a second common source line thereby controlling the first common source line and the second common source line separately;
   a second block switch configured to select a second memory block to drive of the plurality of memory blocks and apply a driving voltage to the second memory block, the second block switch including a third transistor for selecting a third common source line and a fourth transistor for selecting a fourth common source line thereby controlling the third common source line and the fourth common source line separately;
   first, second, third, and fourth cell strings, wherein each of the first to fourth cell strings comprises a drain select transistor, a plurality of cell transistors, and a source select transistor connected in series;
   a first bit line coupled to the first and third cell strings;
   a second bit line coupled to the second and fourth cell strings;
   the first and second common source lines switched by the first block switch, the first common source line being coupled to a source of the source select transistor of the first cell string, the second common source line being coupled to a source of the source select transistor of the second cell string;
   the third and fourth common source lines switched by the second block switch, the third common source line being coupled to a source of the source select transistor of the fourth cell string, the fourth common source line being coupled to a source of the source select transistor of the third cell string, wherein the first and third common source lines are separated from the second and fourth common source lines by a predetermined interval respectively;
drain contacts coupling the respective bit lines to the respective cell strings; and
source contacts coupling the respective common source lines to the respective cell strings, wherein the drain contacts and the source contacts are alternately disposed.

2. The flash memory device of claim 1, wherein the first block switch comprises:
a first block select circuit adapted to apply a block select signal for selecting the first memory block to drive; and
first pass transistors adapted to perform a switching operation for applying a predetermined voltage to a word line in the first memory block through a global word line.

3. The flash memory device of claim 2, wherein the first block select circuit comprises a first block repair fuse for repairing a defective block.

4. The flash memory device of claim 2, wherein the first pass transistors comprise a drain select transistor, a source select transistor, a cell select transistor, a transistor for selecting the first common source line, and a transistor for selecting the second common source line.

5. The flash memory device of claim 4, wherein the transistor for selecting the first common source line comprises a gate connected to a block word line, a drain connected to a first global source line, and a source connected to the first common source line.

6. The flash memory device of claim 4, wherein the transistor for selecting the second common source line comprises a gate connected to a block word line, a drain connected to a second global source line, and a source connected to the second common source line.

7. The flash memory device of claim 2, wherein the second block switch comprises:
a second block select circuit adapted to apply a second block select signal for selecting the second memory block to drive; and
second pass transistors adapted to perform a switching operation for applying a predetermined voltage to a word line in the second memory block through a global word line.

8. The flash memory device of claim 7, wherein the second block select circuit comprises a second block repair fuse for repairing a defective block.

9. The flash memory device of claim 7, wherein the second pass transistors comprise a drain select transistor, a source select transistor, a cell select transistor, a transistor for selecting the third common source line, and a transistor for selecting the fourth common source line.

10. The flash memory device of claim 9, wherein the transistor for selecting the third common source line comprises a gate connected to a block word line, a drain connected to a first global source line, and a source connected to the third common source line.

11. The flash memory device of claim 9, wherein the transistor for selecting the fourth common source line comprises a gate connected to a block word line, a drain connected to a second global source line, and a source connected to the fourth common source line.

12. The flash memory device of claim 1, wherein:
the first common source line is disposed on a first side of word lines of the first and second cell strings; and
the second common source line is disposed on a second side of the word lines of the first and second cell strings, the second side of the word lines of the first and second cell strings being opposite to the first side of the word lines of the first and second cell strings.

13. The flash memory device of claim 12, wherein:
the third common source line is disposed on a first side of word lines of the third and fourth cell strings;
the fourth common source line is disposed on a second side of the word lines of the third and fourth cell strings, the second side of the word lines of the third and fourth cell strings being opposite to the first side of the word lines of the third and fourth cell strings; and
the third common source line is disposed between the word lines of the first and second cell strings and the word lines of the third and fourth cell strings.

* * * * *